(12) United States Patent
Stewart et al.

(10) Patent No.: US 7,504,182 B2
(45) Date of Patent: Mar. 17, 2009

(54) PHOTOLITHOGRAPHY MASK REPAIR

(75) Inventors: Diane K. Stewart, Ipswich, MA (US); J. David Casey, Jr., West Roxbury, MA (US); Joan Williams Casey, legal representative, West Roxbury, MA (US); John Beaty, Belmont, MA (US); Christian R. Musil, Cambridge, MA (US); Steven Berger, Portland, OR (US)

(73) Assignee: FEI Company, Hillsboro, OR (US)

( * ) Notice: Subject to any disclaimer, the term of this patent is extended or adjusted under 35 U.S.C. 154(b) by 987 days.

(21) Appl. No.: 10/664,247

(22) Filed: Sep. 17, 2003

(65) Prior Publication Data

US 2004/0151991 A1    Aug. 5, 2004

Related U.S. Application Data

(60) Provisional application No. 60/411,699, filed on Sep. 18, 2002.

(51) Int. Cl.
    *G03F 1/00* (2006.01)
(52) U.S. Cl. .......................................... 430/5
(58) Field of Classification Search ............ 427/5, 427/30, 270, 905, 419.1, 404, 523, 492.3; 430/5; 204/192.1, 192.2
    See application file for complete search history.

(56) References Cited

U.S. PATENT DOCUMENTS 4,249,077 A    2/1981  Crawford (Continued)

FOREIGN PATENT DOCUMENTS

JP    05-174768    7/1993

(Continued)

OTHER PUBLICATIONS

C.K. Crawford, Charge Neutralization Using Very Low Energy Ions, Scanning Electron Microscopy, 1979, II, SEM INc., USA.

(Continued)

*Primary Examiner*—Stephen Rosasco
(74) *Attorney, Agent, or Firm*—Scheinberg & Griner, LLP; Michael O. Scheinberg; Robert McMinn

(57) ABSTRACT

Masks can be repaired by creating a structure that is different from the original design, but that produces the same aerial image. For example, missing opaque material can be replaced by implanting gallium atoms to reduce transmission and quartz can be etched to an appropriate depth to produce the proper phase. In another aspect, a laser or other means can be used to remove an area of a mask around a defect, and then mask structures, either the intended design structures or alternate structures that produce the same aerial image, can be constructed using charged particle beam deposition and etching. For example, an electron beam can be used to deposit quartz to alter the phase of transmitted light. An electron beam can also be used with a gas to etch quartz to remove a layer including implanted gallium atoms. Gallium staining can also be reduced or eliminated by providing a sacrificial layer that can be removed, along with the implanted gallium atoms, using, for example, a broad ion beam. In another aspect, a charged particle beam can be programmed to etch a defect using three-dimensional information derived from two charged particle beams images of the defect from different angle.

14 Claims, 2 Drawing Sheets

U.S. PATENT DOCUMENTS

| | | | |
|---|---|---|---|
| 4,548,883 | A | 10/1985 | Wagner |
| 5,023,453 | A | 6/1991 | Adachi et al. |
| 5,208,125 | A * | 5/1993 | Lowrey et al. ............... 430/5 |
| 5,272,116 | A | 12/1993 | Hosono |
| 5,578,821 | A | 11/1996 | Meisberger et al. |
| 5,795,688 | A | 8/1998 | Burdorff et al. |
| 5,945,237 | A | 8/1999 | Tanabe |
| 6,016,357 | A * | 1/2000 | Neary et al. ............... 382/144 |
| 6,042,738 | A | 3/2000 | Casey, Jr. et al. |
| 6,091,845 | A | 7/2000 | Pierrat et al. |
| 6,172,363 | B1 | 1/2001 | Shinada et al. |
| 6,184,525 | B1 | 2/2001 | Van Der Mast |
| 6,272,236 | B1 | 8/2001 | Pierrat et al. |
| 6,335,129 | B1 * | 1/2002 | Asano et al. ............... 430/5 |
| 6,346,352 | B1 | 2/2002 | Hayden et al. |
| 6,365,896 | B1 | 4/2002 | Van der Mast |
| 6,368,753 | B1 | 4/2002 | Harriott et al. |
| 6,506,525 | B2 | 1/2003 | Choi et al. |
| 6,525,317 | B1 | 2/2003 | Yang |
| 6,538,254 | B1 | 3/2003 | Tomimatsu et al. |
| 6,590,210 | B1 | 7/2003 | Essers |
| 6,927,003 | B2 | 8/2005 | Kim et al. |
| 7,193,222 | B2 | 3/2007 | Jacka et al. |
| 7,264,905 | B2 | 9/2007 | Nagamura et al. |
| 2004/0146787 | A1 | 7/2004 | Ramstein |
| 2005/0173664 | A1 | 8/2005 | Gnauck |

FOREIGN PATENT DOCUMENTS

| | | |
|---|---|---|
| JP | 7219211 | 8/1995 |
| WO | 9930344 | 6/1999 |

OTHER PUBLICATIONS

Albert Folch et al., High Vacuum Versus, "Environmental" Electron Beam Deposition, Jul./Aug. 1996, B 14(4), pp. 2609-2614, J. Vac. Sci.

Yukinori Ochiai, Electron-Beam-Induced Deposition of Copper with Low Resistivity, Nov./Dec. 1996, B 14(6), pp. 3887-3891, J. Vac. Sci. Technol.

* cited by examiner

PHOTOLITHOGRAPHY MASK REPAIR

This application claims priority from U.S. Provisional Pat. App. No. 60/411,699, filed Sep. 18, 2002, which is hereby incorporate by reference.

TECHNICAL FIELD OF THE INVENTION

The present invention relates to the field of charged particle beam tools for forming, altering and viewing microscopic structures, in particular to repair of photolithography masks.

BACKGROUND OF THE INVENTION

Photolithography is a process that is used to create small structures, such as integrated circuits and micromachines. The photolithography process entails exposing a radiation-sensitive substance, called photoresist, to a pattern of light or other radiation. The pattern is typically created by passing the radiation through a mask, which is composed of a substrate with a pattern on its surface. The pattern blocks some of the radiation or changes its phase to create exposed and unexposed areas on the radiation-sensitive material. In a binary intensity mask, the pattern is made of a light absorbing material on an otherwise transparent substrate. In a phase shift mask ("PSM"), the pattern consists of material that shifts the phase of the light passing though it to create an interference on the photoresist that produces a sharp image. The image produced on the photoresist is referred to as the "aerial image" of the mask. The size of the structure that can be produced is limited by the wavelength of radiation used; shorter wavelengths can produce smaller structures.

As photolithography processes are called upon to produce ever-smaller structures, lithography systems are being developed that use smaller wavelengths of radiation, including infra-red and even x-ray radiation. (The terms "light" and "photolithography" are used in a general sense to also include radiation other than visible light.) Systems are now being developed that can produce structures having dimensions of 70 nm and smaller. Such structures can be fabricated by photolithography using light having a wavelength of 193 nm or 157 nm. Some photolithography masks used with such short wavelengths use a reflective, rather than a transmissive, pattern on the mask because the substrate is not sufficiently transparent to such small wavelengths of radiation. In such masks, radiation is reflected from the mask onto the photoresist.

The photolithography mask must be free of manufacturing imperfections if the mask is to accurately produce the desired exposure pattern. Most newly fabricated masks have defects such as missing or excess pattern material and, before such masks can be used, the defects are repaired, often by using a charged particle beam system to remove or deposit material onto the mask substrate.

The requirement for smaller wafer features in photolithography places ever-increasing demands upon the three-dimensional structuring capabilities of the techniques used to repair defects on the photomasks. Repair strategies for clear defects on chrome binary-intensity-masks (BIM) and molybdenum-silicide attenuated-phase-shift-masks (MoSi PSM) are typically based upon reconstructing as closely as possible the original physical structure of the mask feature along with the optical properties of the materials. While direct replacement, i.e., the substitution of a void with the original mask material, is the most straightforward approach to clear defect repair, a number of practical considerations greatly limit the optical fidelity of this repair strategy. For example, the patching of clear defects, that is, missing absorber or phase shifting material, on both BIM and PSM by focused ion beam (FIB) induced deposition typically does not employ the native masking material but rather a carbon-based material whose height is adjusted to mimic the desired optical properties. In the case of MoSi PSM, the deposited height can satisfy only one of the designed values for phase and transmission; in practice the latter is matched due to the ease of measurement although the former is more important for sharpening the edge transition. Furthermore, the fabrication of a structure by FIB-induced deposition of material from a gas phase onto the surface is a complicated process, which is very difficult to control on the nanometer scale.

In the case of an opaque defect, that is, the presence of extra absorber or phase shift material, the defect can be repaired by removing the extra material using charged particle beam, for example, a focused beam of gallium ions. Unfortunately, the ion beam also damages the mask surface and implants ions into the substrate, which adversely affects the transmission of light through the substrate. As shorter wavelengths are used in photolithography, imperfections in the substrate have a greater effect on the aerial image of the mask. Any alteration of the substrate caused by the repair affects the mask performance, so new mask repair systems are needed that will reduce the effect on the substrate.

One method of reducing the effects of ion beam mask repair entails scanning a charged particle beam across the repaired area in the presence of an etchant gas, such as xenon-difluoride. Such a process is described, for example, in U.S. Pat. No. 6,042,738 to Casey, Jr. et al. The clean-up step described in U.S. Pat. No. 6,042,738 adds an extra step to the mask repair process, and the results may still not be comparable to an area that was originally produced without defect. Thus, a method is needed to correct a defective mask so that it projects the desired image onto a work piece.

Therefore, even after a defect is repaired, the repaired area may still have characteristics that are different those of an area that was originally defect-free. For example,

SUMMARY OF THE INVENTION

An object of the invention is to provide a system for repairing photolithography masks.

The inventive system includes several aspects that facilitate the use of a charged particle beam system for mask repair. In accordance with one aspect of the invention, applicants recognized that just as the optical function of a given mask feature, that is, its aerial image, may be achieved by a wide variety of physical structures including those employed in binary intensity, attenuated phase-shift, and alternating aperture phase-shift mask technologies, similarly, the freedom to design a given optical functionality through different means is also available for the repair of a defect on a photomask feature.

Diverse structures and structuring techniques can be applied to the defect area in order to reproduce the desired aerial image of the feature without necessarily having to recreate the intended structure of the mask feature. In one embodiment of the invention, this freedom is exploited in order to compensate for a missing piece of masking material on BIMs and PSMs. That is, rather than trying to recreate the mask as it was designed, applicants produce an alternative structure that uses implanted ions and that prints the nearly the same circuit feature as the original design. Thus, the effects of scanning a charged particle beam over the mask, which effects are typically unintentional and deleterious, are utilized to effect intended changes in the substrate.

In accordance with other aspects of the invention, multiple steps can be used to repair a defect, including steps involving combinations of ion beam, electron beam, and laser processing. For example, stains from ion implantation can be used as part of the repair, can be removed by an electron beam, or can be removed along with a sacrificial layer. In some repairs, an electron beam can be used in place of an ion beam to eliminate staining. In some repairs, a laser can be used to remove a defective area and then the area can be reconstructed using particle beam deposition.

The foregoing has outlined rather broadly some of the features and technical advantages of various aspects of a preferred system of the present invention in order that the detailed description of the invention that follows may be better understood. Additional features and advantages of the invention will be described hereinafter. It should be appreciated by those skilled in the art that the conception and specific embodiment disclosed herein may be readily utilized as a basis for modifying or designing other structures for carrying out the same purposes of the present invention. It should also be realized by those skilled in the art that such equivalent constructions do not depart from the spirit and scope of the invention as set forth in the appended claims. It should also be realized that while a preferred system for repairing photomasks may implement many of the inventive aspects described below, many of the inventive aspects can be applied independently, or in any combination, depending upon the goals of a specific implementation.

BRIEF DESCRIPTION OF THE DRAWINGS

For a more thorough understanding of the present invention, and the advantages thereof, reference is now made to the following descriptions taken in conjunction with the accompanying drawings, in which.

DETAILED DESCRIPTION OF THE PREFERRED EMBODIMENTS

Applicant recognized that the important end product of a mask repair is not that the original mask is reconstructed, but that the image of the repaired mask projected onto the wafer is as close as possible to the intended image. By using software that calculates the aerial image of a three-dimensional structure on a photomask, applicants are able to prediction of the optical effects of the artifacts which accompany the FIB repair of defects. As a result, a repair can be designed that may not reproduce the intended design structure, but that produces an aerial image that will produce substantially the same result. For example, the light blocking characteristics of gallium staining can be used in the context of a method for defect repair, particularly for repair of clear defects. Basically the gallium implanted during scanning, at certain doses, is sufficient to reduce transmission or reflectivity, akin to material depositions. Another example, which is known in the art, is to repair missing phase shift material by reducing the thickness of the substrate at the defect area, rather than depositing additional phase shift material. The thinned area also shifts the phase of the transmitted light relative to unpatterned substrate.

Repair strategies are preferably based upon the application of nanostructuring methods with high resolution and repeatability. Also, the repair strategy should preferably be such that the aerial image of the repaired area is preferably tolerant to variations in the physical dimensions and optical properties of the repaired feature. Thus, rather than attempting to reconstruct the original structure of the defective area, one can chose a repair technique that has the properties just described and that produces a structure that, while it may be physically different from the intended structure, has a similar aerial image.

Figure 1:
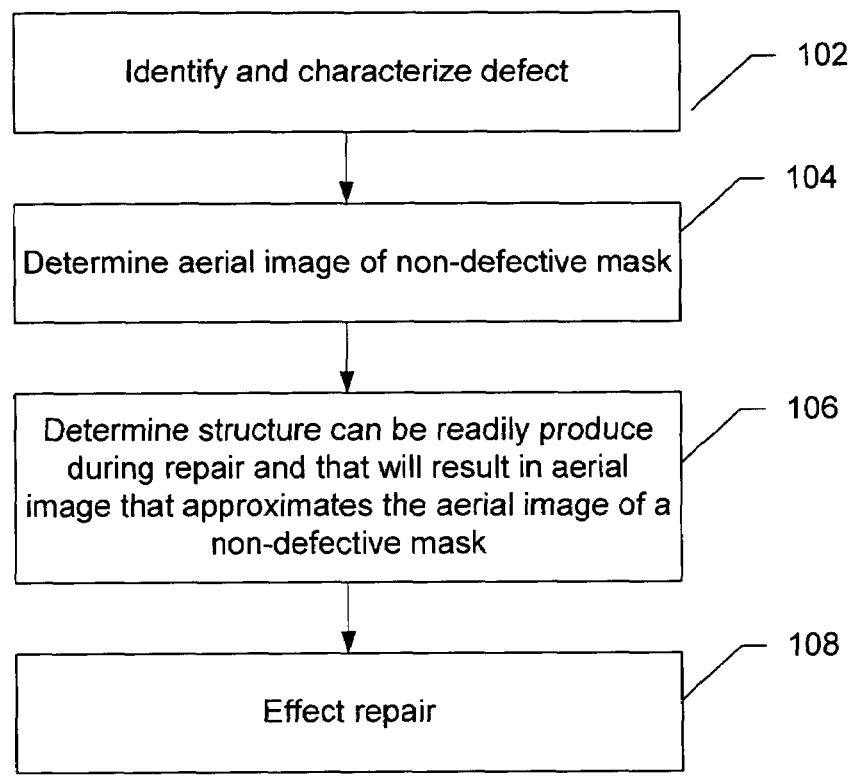
FIG. 1 is a flowchart showing the steps of one preferred embodiment of the invention

FIG. 1 shows a flow chart listing steps of a preferred embodiment of the present invention. In step 102, a defect is identified and characterized. Defects are typically located using a mask inspection tool such as those available from KLA-Tencor Corporation, San Jose, Calif., and then characterized, for example, using a scanning electron microscope or a scanning probe microscope. The data required to characterize a defect for repair depend upon the type of defect and can include, for example, location, size, and topology, that is, its three-dimensional shape. In step 104, the intended aerial image, that is, the projected light from a defect-free mask, for the area adjacent the defect is determined, for example, by using the SOLID-CM program from SIGMA-C GmbH, Munich, Germany. In step 106, a repair strategy is determined that will produce approximately the same aerial image as a defect-free mask. The repair strategy preferably produced a repaired mask that has high transmission at the desired exposure wavelength, and a deviation from the intended feature size, when printed under a predetermined set of stepper and resist parameters, of less than or equal to plus or minus about ten percent. The repair strategy is preferably one that produces a result close to the original mask and that is relatively simple to implement and repeatable. In step 108, the repair is performed. An example of a repair strategy is described below.

An example of a repair strategy that does not recreate the original structure is the use of implanted gallium atoms to correct missing absorber material. The use of FIB milling in conjunction with gallium staining provides a substantial improvement over the prior art carbon deposition repair process in resolution, repeatability, and tolerance to variations in the physical dimensions and optical properties of the repaired feature. In conjunction with mask simulation, the inventive system uses the optical functionality of an unavoidable byproduct of the repair process, to turn the artifact into an asset. By incorporating mask simulation into the repair process, the repair tool can more effectively produce a repaired mask that has properties more similar to the original.

While implantation is an unavoidable consequence of FIB processes, its effects upon the repair of mask defects were previously either ignored or minimized. With the reduction in the wavelength of light used in optical lithography to DUV, the reduction in light transmission attendant with gallium implantation becomes a dominant artifact of the repair process for opaque defects. At a free-space wavelength of 193 nm, a relative transmission of only twenty three percent is experimentally measured for a "saturated" gallium stain, in which an equilibrium has been established between the concurrent effects of the implantation of the ion source species and the removal of the stained quartz substrate by ion-induced sputtering. Rather than treating gallium staining as a detrimental effect that is to be minimized or eliminated, applicants make use of the change in characteristics of the mask due to gallium implanting to repair the mask. This aspect of the invention is referred to as the "functionalization" of the gallium stain for the repair of clear defects.

Ion implantation is a simple, reproducible, and fast FIB-based repair process that can accurately produce a pattern at a high resolution. The functionalization of the implantation staining for the patching of clear defects can provide a number of advantages. Functionalization of the gallium stain enhances the quality of the repair of clear defects on binary intensity and attenuated phase-shift photomasks, in part because the repair process is relatively simple and is more tolerant of system errors and also because the invention can predictably vary the phase characteristics of the repaired area at a fixed transmission.

In some embodiments, metallic atoms are implanted into the transparent substrate by a focused beam of ionized metal atoms to repair clear defects on binary intensity masks. Saturated stains, in which an equilibrium is reached in the composition of the sputtered surface, are readily achieved with current FIB repair tools and provide a controlled and reproducible method for fabricating a fixed transmission loss over an arbitrary area. Phase effects due to the use of non-opaque material for the masking layer and due to the etching of the quartz substrate which occurs prior to the establishment of a saturated stain are controlled by varying the depth etched into the quartz. Thus, the repaired area can produce not only the transmission, but also the phase, of the original mask design. The phase effects are used not only in the repair of phase shift masks, but to produce the desired aerial image in binary masks.

As another example, the invention can be used to repair clear defects on an attenuated phase shift masks. Saturated stains provide a more controlled and reproducible method for the precise definition of a fixed transmission loss over an arbitrary area than the current carbon patch process. Furthermore, phase effects can be independently controlled by varying the depth etched into the quartz. For example, one might etch a step into quartz to mimic the desired phase, and then subsequently deposit a material of the desired thickness to provide the intended transmission.

Figure 2:
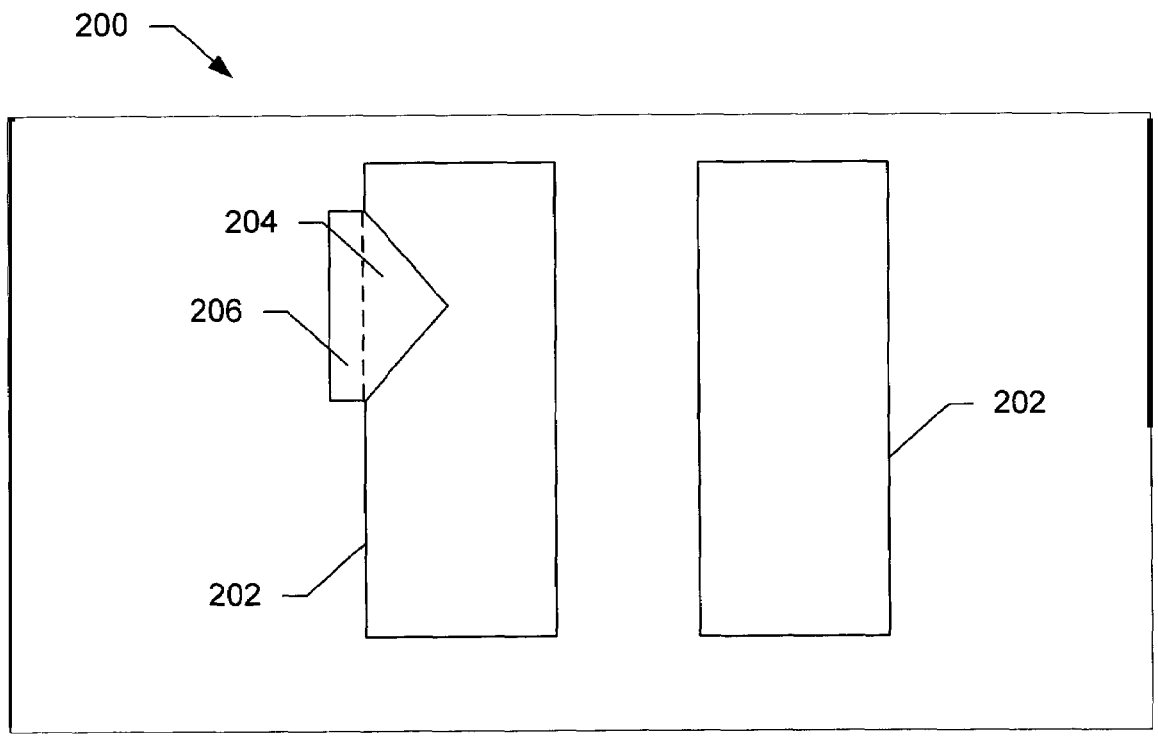
FIG. 2 shows a clear defect and its repair.

FIG. 2 illustrates a simple repair designed to use a gallium stain to fix a clear defect in a binary mask 200. Mask 200 includes chromium lines 202 spaced 400 nm apart, and one line 202 is missing chromium absorber in a triangular defect region 204. Clear defect region 204 extends about 400 nm along the edge of chromium line 202 intrudes about 200 nm into chromium line 202. In accordance with an embodiment of the invention, the defect is repaired by filling the triangular defect area 204, along with a rectangular area 206 that extends 80 nm into the quartz space, with a saturated Ga stain, that comprises gallium atoms from a gallium liquid metal ion beam implanted into the quartz to depth of about 24 nm. In other words, rather than filling clear defect area 204 with an opaque material such as carbon, gallium is implanted into the clear defect area and into an adjacent area extending past the originally intended edge of the chromium line. The resulting aerial image of the mask than approximates the aerial image of a mask that manufactured without the defect.

For the repair described above, the transmission values that are predicted by the version 2.7.0 of the SOLID-CM topographic mask simulator at specific locations in this repair are shown in Table 1:

TABLE 1

Transmission For Ga-Stained Repair Process

| | Transmission | | |
|---|---|---|---|
| | at the middle of Qz space | under Cr line with defect | under Cr line next to defect |
| Original Defect | 119.8% | 134.8% | 101.9% |
| With Ga Stain | 97.6% | 106.2% | 96.9% |

Because light is diffracted, that is, bent around the edge of the chrome lines, light is detected in areas under the chrome lines and near the edges of the chrome lines. TABLE 1 shows that the transmission is significantly reduced by the gallium staining. In the table of FIG. 1, 100% represents the light that would be transmitted at a location if there were not missing absorber material. The high transmission values, that is, greater than 100%, are due to missing chrome, which would 'block' the light. The transmission is restored to closer to the desirable 100% by blocking some light with the nontransparent gallium imbedded in the quartz. The extension of the stain outside the original defect area into the surrounding quartz compensates for the partially transparency in the area of the missing chromium and substantially improves the optical fidelity of the repaired feature. The thickness is somewhat reduced by etching during implantation.

For attenuated phase-shift masks, the depth of the etched region with the saturated gallium stain is adjusted in order to produce the desired phase shift relative to the unetched and unstained quartz. As in binary masks, the discrepancy between the desired transmission and the actual saturated stain transmission is compensated for by adjusting the boundaries of the repair area.

The repair can be performed using the same focused ion beam system scanning parameters, i.e., pixel spacing/timing and charge neutralization scheme, during the repair that are used in imaging. With this embodiment, there is no halo, that is, no unintentional deposition in the outskirts of the beam, which causes undesirable transmission loss or flood gun stain to cleanup or to compensate for. As in the repair of opaque defects, edge biases, that is, placement of the edge of the repair offset from the edge of the feature, should be selectively adjusted to improve transmission. Typically this means deliberately overetching about 30 nm into a chrome line. This repair strategy has greater tolerance for edge-placement error than does a deposition of an opaque material, because of the partial transparency of the stain.

The invention is particularly useful for, although not limited to, repairing lithography masks used for the 70 nm lithography node and beyond, including optical, x-ray, extreme ultra violet (EUV), different absorbers, and phase shift masks technologies.

Figure 3:
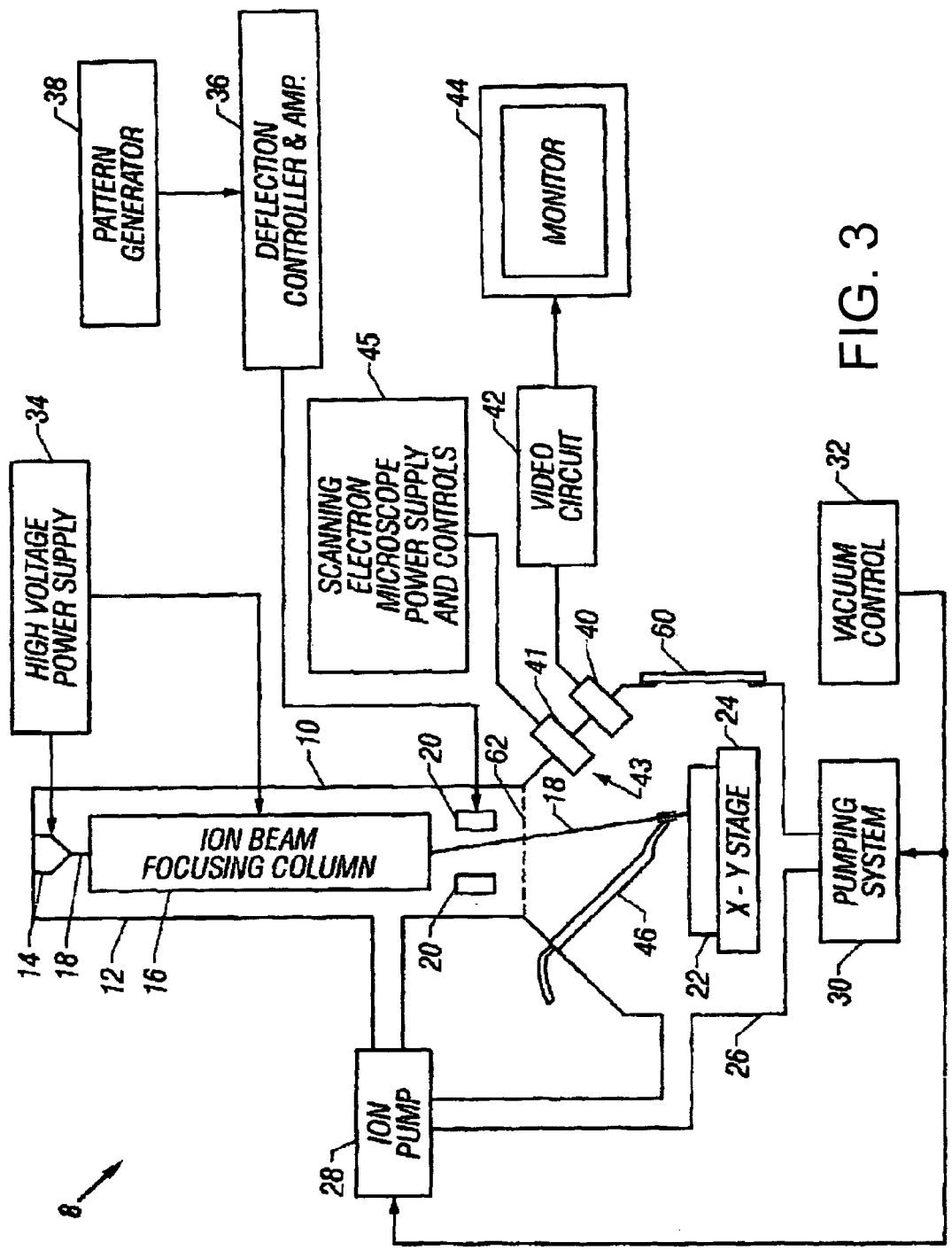
FIG. 3 shows a dual beam system that could be used to repair a mask in accordance with the invention.

FIG. 3 shows schematically a dual beam system 300 that is useful for implementing the invention. System 300 includes an ion beam column 302 and an electron beam column 304. The two beams impinge a work piece 306 at points 308 and 310 respectively, points 308 and 310 being a known, small distance apart, so that a point on the work piece can be readily shifted to use the appropriate beam. Such a system is described, for example, in U.S. Provisional Pat. App. No. 60/487,792, filed Jul. 14, 2003 for a "Dual Beam System." A charge neutralization device, such as a flood gun or an ion generator, can be used to neutralize charge accumulated on the mask. The stage that supports the work piece preferably has nanometer repeatability to allow for imaging with the SEM, and repositioning under FIB to ensure edge placement error less than 7 nm at three standard deviations. Edge placement, that is, determining the relative position of the edge of the repaired area compared to the edge of the feature above or below the repair, can be determined using an optical laser, or preferably using ion beam imaging, which applicants have shown to be more accurate for edge placement than laser methods.

In other embodiments, the columns are arranged such that the beams are parallel, as described in U.S. Prov. Pat. App. 60/411,699, filed Sep. 18, 2002, and uses an ion generator for charge neutralization. One column is preferably tilted or tiltable with respect to the other column to provide three-dimensional topographical information for phase shift mask repair.

Focused ion beam column 302 includes an ion source 308, preferably a gallium liquid metal ion source (LMIS). Other ion sources that could be used include a silicon/gold eutectic LMIS and a plasma ion source, depending upon the repair strategy. By using a mask simulation program as described above, skilled persons would be able to determine the effects of the implantation of materials other than gallium and use those effect to effect repair of defects. The column can use a focused beam or a shaped beam. The invention is not limited to any particular type of charged particle beam column.

Mask repair can use both electron beam and ion beam etching and deposition. In embodiments in which it is not desired to use ion implantation staining, an electron beam repair is preferred because it eliminates ion implantation. For example, MoSi and $TaN_2$ absorber material can be etched using an electron beam and an etchant gas, such as $XeF_2$, as described in U.S. patent application Ser. No. 10/206,843 for "Electron Beam Processing," by Musil et al., which is hereby incorporated by reference. The gallium beam can be also be used for etching chrome, and the gallium-implanted layer can be removed using the gas assisted etching using the ion beam or an electron beam.

Using a tilted beam can provide three-dimensional information about the work piece. Three-dimensional information is useful, for example, in the repair of quartz bumps defects on a phase shift mask. Such defects, being made of the same material as the substrate, do not exhibit much contrast with the substrate in an image, and so can be difficult to repair without damaging the substrate. U.S. patent application Ser. No. 10/636,309, filed Aug. 7, 2003, for "Repairing Defects On Photomasks Using A Charged Particle Beam And Topographical Data From A Scanning Probe Microscope," describes a method of using three-dimensional topographical information to repair defects in phase shift masks. A tilted charged particle beam can be used to provide a three-dimensional image instead of the Scanning Probe Microscope described in U.S. patent application Ser. No. 10/636,309. If a charged particle beam system provides the three-dimensional data, it becomes unnecessary to remove the work piece from the vacuum chamber to obtain the information, thereby improving productivity.

A strategy to repair a particular defect can include multiple stages, using combinations of ion, electron or lasers. For example, an ion beam can be used to remove an opaque defect and then an electron beam can be used to etch a layer of gallium-implanted quartz using $XeF_2$ as post processing to restore transmission.

In another repair strategy, an electron beam can be used to repair missing quartz on PSM masks. For example, when an electron beam is scanned over the defect in the presence of a precursor gas, such as TEOS or TMCTS, the precursor gas will decompose under the influence of the electron beam to deposit quartz to replace the missing quartz of the mask. In some embodiments, one can also supply an oxygen-containing material, such as water, oxygen, or hydrogen peroxide, to supply additional oxygen to assist in the quartz deposition. The deposited structures can be used to simultaneously match phase and transmission of the mask.

In another repair strategy, a sacrificial layer of quartz can be globally or selectively added to the mask substrate during its manufacture. After all necessary mask repairs are performed, the sacrificial layer can be removed to remove any gallium-implanted quartz. The sacrificial layer can be removed, for example, using a broad ion beam.

To ensure that defects are removed without damaging the substrate, the edges can be verified in situ with imaging software as described in U.S. patent application for "Graphical Automated Machine Control and Metrology" filed Aug. 23, 2002 by Tasker et al.

In another embodiment, a laser is used to coarsely remove pattern containing any defect, and a FIB or electron beam is used to recreate entire pattern with improved fidelity. The pattern is recreated by charged particle beam deposition, or, for example, in a phase shift mask, by etching. The use of lasers is described, for example, in U.S. Pat. No. RE37,585 to Mourou et al. and U.S. Pat. No. 6,333,485 to Haight et al.

In other embodiment, one can use a removable passivation of non-defective regions of the mask during etch gas chemistries. Such a layer is described in U.S. patent application Ser. No. 10/206,843.

In accordance with various repair strategies that can be used, a work piece can be processesed using an electron beam or an ion beam. The effects of ion implantation can be: 1. avoided by using an electron beam for some operations; 2. used constructively to provide desired optical properties; or 3. eliminated by removal of the implanted layer. Multi-stage operations that use a combination of laser beams, ion beams, and electron beams can speed operations and reduce defects. For example, an ion beam can be used to process a defect and then an electron beam can be used to remove the effects of the ion beam.

FIG. 3 shows a typical dual beam system 8 that can be used to practice some of the methods of the present invention. Dual beam system 8 includes an evacuated envelope 10 having an upper neck portion 12 within which are located a liquid metal ion source 14 and a focusing column 16 including extractor electrodes and an electrostatic optical system. Ion beam 18 passes from source 14 through column 16 and between electrostatic deflection means schematically indicated at 20 toward sample 22, which comprises, for example, a photolithography mask positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32. The vacuum system provides within chamber 26 a vacuum of between approximately $1 \times 10^{-7}$ Torr and $5 \times 10^{-4}$ Torr. When an etch-assisting or an etch retarding gas is used, the chamber background pressure is typically about $1 \times 10^{-5}$ Torr.

High voltage power supply 34 is connected to liquid metal ion source 14 as well as to appropriate electrodes in focusing column 16 for forming an approximately 1 keV to 60 keV ion beam 18 and directing the same downwardly. Deflection controller and amplifier 36, operated in accordance with a prescribed pattern provided by pattern generator 38, is coupled to deflection plates 20 whereby beam 18 may be controlled to trace out a corresponding pattern on the upper surface of sample 22. The pattern to be traced is described in detail below. In some systems the deflection plates are placed before the final lens, as is well known in the art.

The source 14 typically provides a metal ion beam of gallium, although other ion sources, such as a multicusp or other plasma ion source, can be used. The source typically is capable of being focused into a sub one-tenth micron wide beam at sample 22 for either modifying the surface 22 by ion milling, enhanced etch, material deposition, or for the purpose of imaging the surface 22. An charged particle multiplier 40 used for detecting secondary ion or electron emission for imaging is connected to video circuit and amplifier 42, the latter supplying drive for video monitor 44 also receiving deflection signals from controller 36. The location of charged particle multiplier 40 within chamber 26 can vary in different embodiments. For example, a preferred charged particle multiplier 40 can be coaxial with the ion beam and include a hole for allowing the ion beam to pass. A scanning electron microscope 41, along with its power supply and controls 45, are preferably provided with the FIB column. A fluid delivery system 46 optionally extends into lower chamber 26 for introducing and directing a gaseous vapor toward sample 22.

A door 60 is opened for inserting sample 22 on stage 24 which may be heated or cooled, and also for servicing the reservoir 50. The door is interlocked so that it cannot be opened if the system is under vacuum. The high voltage power supply provides an appropriate acceleration voltage to electrodes in ion beam column 16 for energizing and focusing ion beam 18. When it strikes the work piece, material is sputtered, that is physically ejected, from the sample. Dual beam systems are commercially available, for example, from FEI Company, Hillsboro, Oreg., the assignee of the present application. The invention can also be practiced on single or multiple beam systems. It is preferable to have use charge neutralization when repairing a mask, because the insulating substrate tends to accumulate electrical charge which can displace the landing position of the beam on the surface, and consequently alter the location of the repair. For example, charge can be neutralized using an electron flood gun or an ion generator, as described in U.S. Prov. Pat. App. No. 60/411, 699.

The inventive system described above includes many novel aspects and has many practical applications. Many of the novel aspects can be applied independently of the other novel aspects and are thought to be separately patentable. Not all aspects of the inventions will be included in all embodiments.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim:

1. A method for repairing a defect in a photolithography mask including a transparent substrate and a pattern of opaque material, the defect being an absence of opaque material on an area that should be covered by an opaque material, the method comprising:

scanning a beam of metallic ions over the defect area to implant metallic atoms into the defect area, the metal atoms reducing the transparency of the defect area without depositing an opaque material to cover the defect area.

2. The method of claim 1 further comprising scanning a beam of metallic ions over a non-defective area of the transparent substrate near the defect to implant metallic atoms in the non-defective area, the implantation of the metallic atoms in the non-defective area causing the aerial image of the repaired mask to more closely resemble the aerial image of a non-defective mask.

3. The method of claim 1 further comprising thinning an area of the substrate to alter the phase of transmitted light.

4. A method for repairing a defect in a photolithography mask including a transparent substrate and a pattern of material, a first area around the defect characterized by a design aerial image, the defect being an absence of material on a second area that should be covered by a material or the presence of material on the second area that should not be covered by the material, the method comprising:

scanning a beam of ions over a third area to implant atoms into the third area, the atoms altering the third area and causing an actual repaired aerial image of the first area to approiuiniate the design aerial image more closely than did an actual unrepaired aerial image.

5. The method of claim 4 in which the defect comprises a clear defect in a binary mask and in which scanning a beam of ions over a third area to implant atoms into the third area includes scanning a beam of metallic ions over the third area to implant metallic atoms into the third area to reduce its transparency.

6. The method of claim 5 in which scanning a beam of metallic ions over the third area to implant metallic aidma into the third area to reduce its transparency includes scanning a beam of metallic ions over a defect area and a non-defect area to implant metallic atoms into the defect area and a non-defect area to reduce transparency.

7. The method of claim 6 in which scanning a beam of metallic ions over a defect area and a non-defect area to implant metallic atoms into the defect area and a non-defect area to reduce its transparency includes scanning a beam of metallic ions over a defect area and a non-defect area to implant metallic atoms into the defect area and a non-defect area adjacent the defect area to reduce transparency.

8. The method of claim 4 in which the defect comprises a clear defect in a phase shift mask and in which scanning a beam of ions over a third area to implant atoms into the third area includes scanning a beam of metallic ions over the third area to reduce its thickness to alter the phase of transmitted light and to implant metallic atoms into the third area to reduce its transparency.

9. A method for repairing a defect in a photolithoaraphy mask, comprising:

locating a defect on a mask;

characterizing the defect;

determining an intended aerial image corresponding to an area of the mask that includes the defect;

determining an alternate structure that will provide an aerial image similar to the intended aerial image, in which determining an alternate structure that will provide an aerial image similar to the intended aerial image includes determining an alternate structure that includes an area of metallic atoms implanted by an ion beam; and effecting the alternate structure on the mask.

10. The method of claim 9 in which the area of metallic atoms implanted by an ion beam includes an area of an opaque defect.

11. The method of claim 10 in which the area of metallic atoms implanted by an ion beam further includes a non-defective area.

12. A method for repairing a photolithography mask including a pattern on a substrate, the mask having a defect such that the actual pattern on the mask is different from an intended design pattern, comprising:

using a laser to remove an area of the pattern including the defect;

using one or more charged particle beams to recreate in the area a pattern that provides approximately the aerial image as the intended design pattern in the area.

13. The method of claim 12 in which using one or more charged particle beams to recreate in the area a pattern that provides approximately the aerial image as the intended design pattern in the area includes using an ion beam to implant atoms to alter the transparency of a portion of the mask.

14. The method of claim 12 in which using one or more charged particle beams to recreate in the area a pattern that provides approximately the aerial image as the intended design pattern in the area includes using an ion beam to deposit ions to alter the transparency of a portion of the mask.

* * * * *